United States Patent
Henneberger et al.

(10) Patent No.: US 8,987,713 B2
(45) Date of Patent: Mar. 24, 2015

(54) ARRANGEMENT FOR GENERATING ELECTROMAGNETIC RADIATION

(75) Inventors: Fritz Henneberger, Lehnitz (DE); Henning Riechert, Ottobrunn (DE); Norbert Koch, Berlin (DE)

(73) Assignees: Humboldt-Universitat Zu Berlin, Berlin (DE); Forschungsverbund Berlin E.V., Berlin (DE)

( * ) Notice: Subject to any disclaimer, the term of this patent is extended or adjusted under 35 U.S.C. 154(b) by 213 days.

(21) Appl. No.: 13/643,767

(22) PCT Filed: Apr. 20, 2011

(86) PCT No.: PCT/DE2011/050011
§ 371 (c)(1),
(2), (4) Date: Jan. 3, 2013

(87) PCT Pub. No.: WO2011/134464
PCT Pub. Date: Nov. 3, 2011

(65) Prior Publication Data
US 2013/0092908 A1     Apr. 18, 2013

(30) Foreign Application Priority Data
Apr. 30, 2010    (DE) .................. 10 2010 019 660

(51) Int. Cl.
*H01L 35/24*     (2006.01)
*H01L 51/50*     (2006.01)
(Continued)

(52) U.S. Cl.
CPC ............ *H01L 51/5088* (2013.01); *B82Y 20/00* (2013.01); *H01L 51/52* (2013.01); *H01L 51/56* (2013.01)
USPC ................................. 257/40; 257/E51.001

(58) Field of Classification Search
USPC ............................................ 257/40, E51.001
See application file for complete search history.

(56) References Cited

U.S. PATENT DOCUMENTS

| | | |
|---|---|---|
| 5,898,185 A | 4/1999 | Bojarczuk, Jr. et al. |
| 2005/0227391 A1 | 10/2005 | Jin et al. |

(Continued)

FOREIGN PATENT DOCUMENTS

| | | |
|---|---|---|
| DE | 10 2008 010 031 A1 | 4/2009 |
| EP | 1 798 783 A2 | 6/2007 |
| WO | WO 2009/003150 A2 | 12/2008 |

OTHER PUBLICATIONS

International Preliminary Report on Patentability PCT/DE2011/050011 dated Nov. 6, 2012.

(Continued)

*Primary Examiner* — Anthony Ho
(74) *Attorney, Agent, or Firm* — Foley & Lardner LLP

(57) ABSTRACT

The invention relates, inter alia, to an arrangement (10) for generating electromagnetic radiation, wherein the arrangement comprises inorganic semiconductor material and organic material (130), characterized by a semiconductor cylinder (30, 40) composed of inorganic semiconductor material and a charge carrier injection zone (50) situated in the semiconductor cylinder, wherein the charge carrier injection zone adjoins the lateral surface (110) of the semiconductor cylinder, the organic material (130) is suitable for emitting electromagnetic radiation in the case of a charge carrier recombination, and the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material, and excite there the emission of electromagnetic radiation by recombination.

8 Claims, 5 Drawing Sheets

Figure 1:
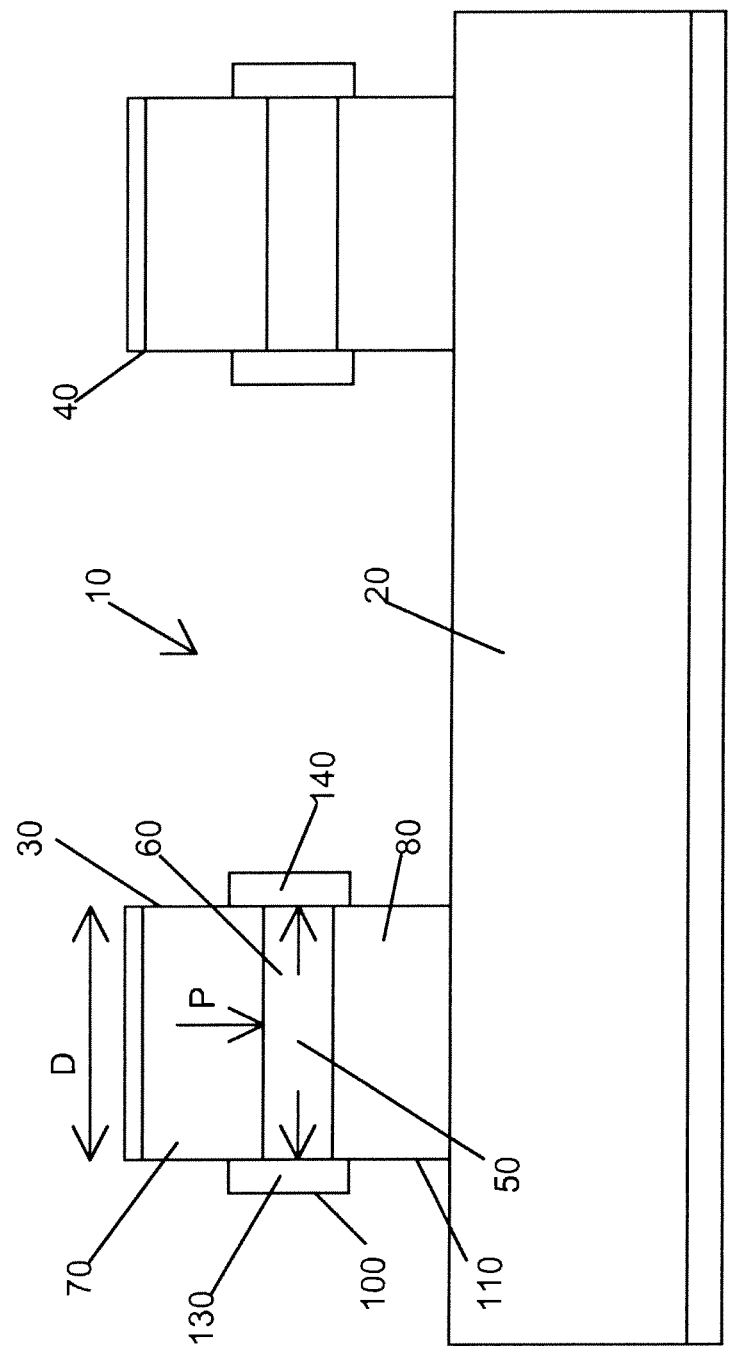

(51) Int. Cl.
*B82Y 20/00* (2011.01)
*H01L 51/52* (2006.01)
*H01L 51/56* (2006.01)

(56) References Cited

U.S. PATENT DOCUMENTS

2005/0269576 A1  12/2005  Park et al.
2007/0237479 A1  10/2007  Seol et al.

OTHER PUBLICATIONS

S. Blumstengel et al., "Electronic coupling of optical excitations in organic/inorganic semiconductor structures", New Journal of Physics, 10 (2008), 065010, 1-17.

Jong H. Na et al., "Dual luminescence from organic/inorganic hybrid p-n junction light emitting diodes", Appl. Phys. Lett, 94, 213302-1-213302-3, 2009.

Cheng-Hsuan Chou et al., "Hybrid White-Light Emitting-LED Based on Luminescent Polyfluorene Polymer and Quantum Dots", Journal of Nanoscience and Nanotechnology, vol. 7, 2785-2789, 2007.

G. Heliotis et al., "Wavelength-tunable and white-light emission from polymer-converted micropixellated InGaN ultraviolet light-emitting diodes", Institute of Physics Publishing, Journal of Optics A: Pure and Applied Opitics, 8, 2006, 5445-5449.

"Electro-Optic Materials Based Upon Inorganic Semiconductor Nanorod Liquid Crystals", A.P. Alivsiatos, 2006, pp. 1-4.

International Search Report PCT/DE2011/050011 dated Apr. 10, 2011.

ARRANGEMENT FOR GENERATING ELECTROMAGNETIC RADIATION

The invention relates to an arrangement for generating electromagnetic radiation, wherein the arrangement comprises inorganic semiconductor material and organic material. A corresponding arrangement is described for example in the document "Dual luminescence from organic/inorganic hybrid p-n-junction light-emitting diodes" (Jong H. Na, M. Kitamura, M. Arita, Y. Arakawa; Applied Physics Letters, 94, 213302, 2009).

The invention is based on the object of specifying an arrangement for generating electromagnetic radiation in which a very high efficiency is achieved, that is to say that the ratio between the electromagnetic radiation energy generated and the electrical energy necessary therefor for excitation is as high as possible.

This object is achieved according to the invention by means of a semiconductor cylinder composed of inorganic semiconductor material and a charge carrier injection zone situated in the semiconductor cylinder, wherein the charge carrier injection zone adjoins the lateral surface of the semiconductor cylinder, the organic material is suitable for emitting electromagnetic radiation in the case of a charge carrier recombination, and the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material and excite there the emission of electromagnetic radiation by recombination.

An essential advantage of the arrangement according to the invention can be seen in the fact that charge carriers can, with a very high efficiency, penetrate into the optically active organic material (e.g. organic semiconductor material) and recombine there with the emission of electromagnetic radiation, since the optically active material bears on the outside of the lateral surface of the semiconductor cylinder and, consequently, electron-hole pairs from the charge carrier injection zone of the semiconductor cylinder can cross very efficiently into the organic material.

Between the charge carrier injection zone and the lateral surface of the semiconductor cylinder or between the charge carrier injection zone and the organic material there can be a direct electronic contact, but this is not absolutely necessary. It suffices if the charge carrier injection zone and the organic material are in contact indirectly and the charge carriers, on account of their diffusion length, have the possibility of reaching the vicinity of the lateral surface and of the organic material by diffusion and of penetrating into the organic material by non-radiative energy transfer.

In one preferred configuration of the arrangement it is provided that the charge carrier injection zone is formed by a cylinder layer arranged transversely with respect to the cylinder longitudinal axis of the semiconductor cylinder, and the organic material forms an optically active ring bearing radially on the outside of said cylinder layer of the semiconductor cylinder, at least at the level of the charge carrier injection zone.

Preferably, the semiconductor cylinder comprises at least one cylinder layer composed of p-doped inorganic material and at least one cylinder layer composed of n-doped inorganic material, and the charge carrier injection zone preferably lies between the p-doped and n-doped cylinder layers. Such a pn structure enables charge carriers to be injected by the application of a forward voltage.

It is also considered to be advantageous if the semiconductor cylinder comprises at least one weakly doped or undoped cylinder layer, and the charge carrier injection zone lies in the weakly doped or undoped cylinder layer. By way of example, the charge carrier injection zone can be arranged in the i-region of a pin diode or the p-doped, the n-doped and the weakly or undoped cylinder layers can form a pin diode.

The organic material preferably consists of or at least also comprises a conjugated polymer or conjugated molecules. The conjugated polymers or the conjugated molecules can contain, for example, monomers or covalently bonded units of thiophene, phenylene, phenylenevinylene, fluorene, quinoxaline, arylamine, pyridine or organic transition or heavy metal complexes.

In order to enable diffusion of all charge carriers injected into the charge carrier injection zone to the lateral surface and subsequent energy transfer into the organic material, it is considered to be advantageous if the cylinder diameter of the semiconductor cylinder is less than the diffusion length of charge carriers (electrons and holes) situated in the charge carrier injection zone.

With regard to emission of visible light it is considered to be advantageous if the band gap of the inorganic semiconductor material in the charge carrier injection zone is between 2.5 and 3.3 eV.

By way of example, the semiconductor material can be an (In,Ga)N material.

For charge carrier concentration, the semiconductor cylinder can have a quantum well structure comprising at least one cylinder layer having a small band gap and at least two adjacent cylinder layers having a larger band gap by comparison therewith; in this case, the organic material will preferably form an optically active ring bearing radially on the outside of at least one cylinder layer having a small band gap.

Such a quantum well structure can consist of an (In,Ga)N/GaN semiconductor material, for example.

It is also possible for the organic material to cover the entire lateral layer of the semiconductor cylinder. In this case, emission of electromagnetic radiation will occur predominantly or exclusively in that region or in those regions which adjoin(s) a charge carrier injection zone, because the charge carrier injection zones make available charge carriers for recombination.

The base and top surfaces of the semiconductor cylinder can be shaped arbitrarily, for example as circular, oval, square, rectangular or polygonal.

The semiconductor cylinder preferably forms a main current path which extends along the cylinder longitudinal direction and injects charge carriers into the charge carrier injection zone; in the charge carrier injection zone a charge carrier diffusion path will form as a result, this path running perpendicular to the main current path, and electron-hole pairs are transported into the vicinity of the organic material and subsequently pass over into the latter by non-radiative energy transfer.

The invention furthermore relates to a method for producing an arrangement for generating electromagnetic radiation, wherein inorganic semiconductor material and organic material are used. According to the invention it is provided that a semiconductor cylinder composed of inorganic semiconductor material with a charge carrier injection zone situated therein is formed, wherein the charge carrier injection zone adjoins the lateral surface of the semiconductor cylinder, and organic material which can emit electromagnetic radiation during charge carrier recombination is applied indirectly or directly at least on that section of the lateral surface which is adjoined by the charge carrier injection zone.

With regard to the advantages of the method according to the invention reference should be made to the above explanations in connection with the arrangement according to the invention, since the advantages of the method according to the invention substantially correspond to those of the arrangement according to the invention.

In accordance with one preferred configuration of the method it is provided that a seed surface (growth seed surface) is applied on a substrate and the semiconductor cylinder is grown on the seed surface by deposition—for example in the context of a self-assembled nanowire growth mechanism. The semiconductor cylinder is preferably grown on the seed surface by means of an MBE method (MBE: molecular beam epitaxy).

The lateral surface of the semiconductor cylinder can be covered for example over the whole area with a layer composed of the organic material.

Moreover, two or more semiconductor cylinders can be produced on the substrate and the region between the semiconductor cylinders can be filled with the organic material.

Alternatively, the lateral surfaces of the semiconductor cylinders can be covered over the whole area with a layer composed of the organic material and the region between the covered semiconductor cylinders can be filled with a transparent filling material.

Figure 2:
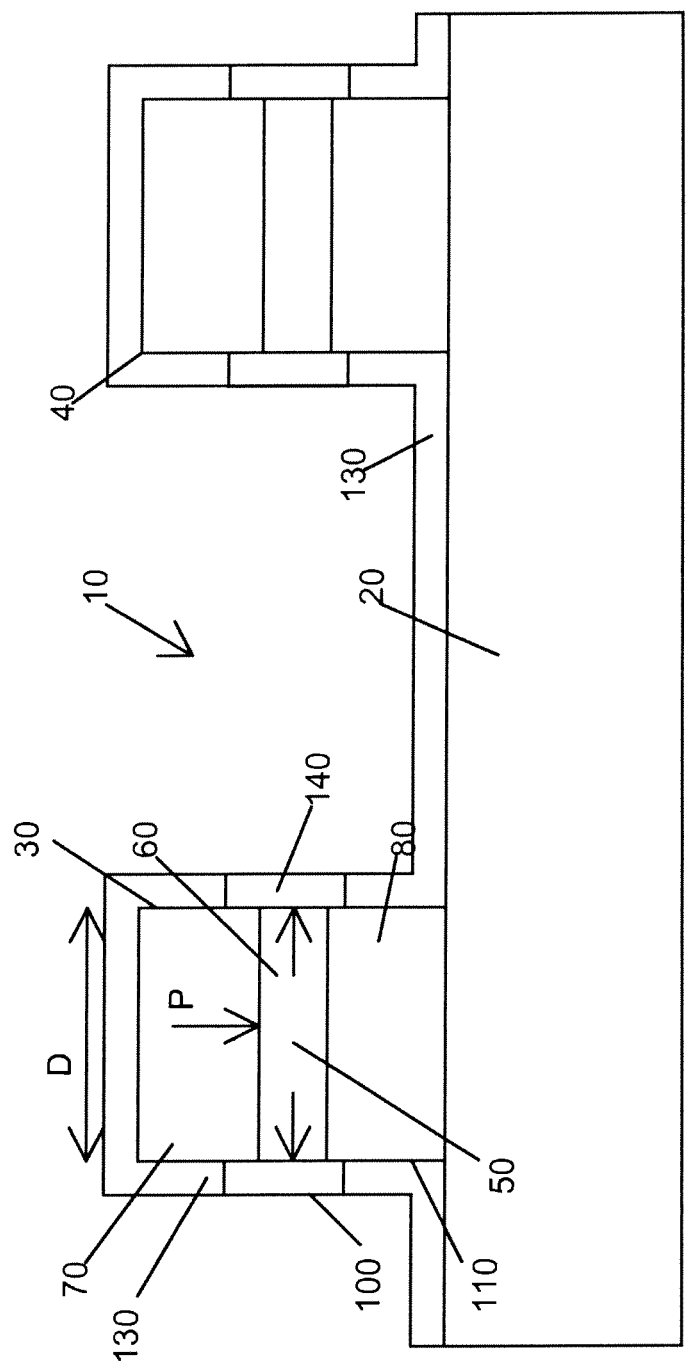
Figure 3:
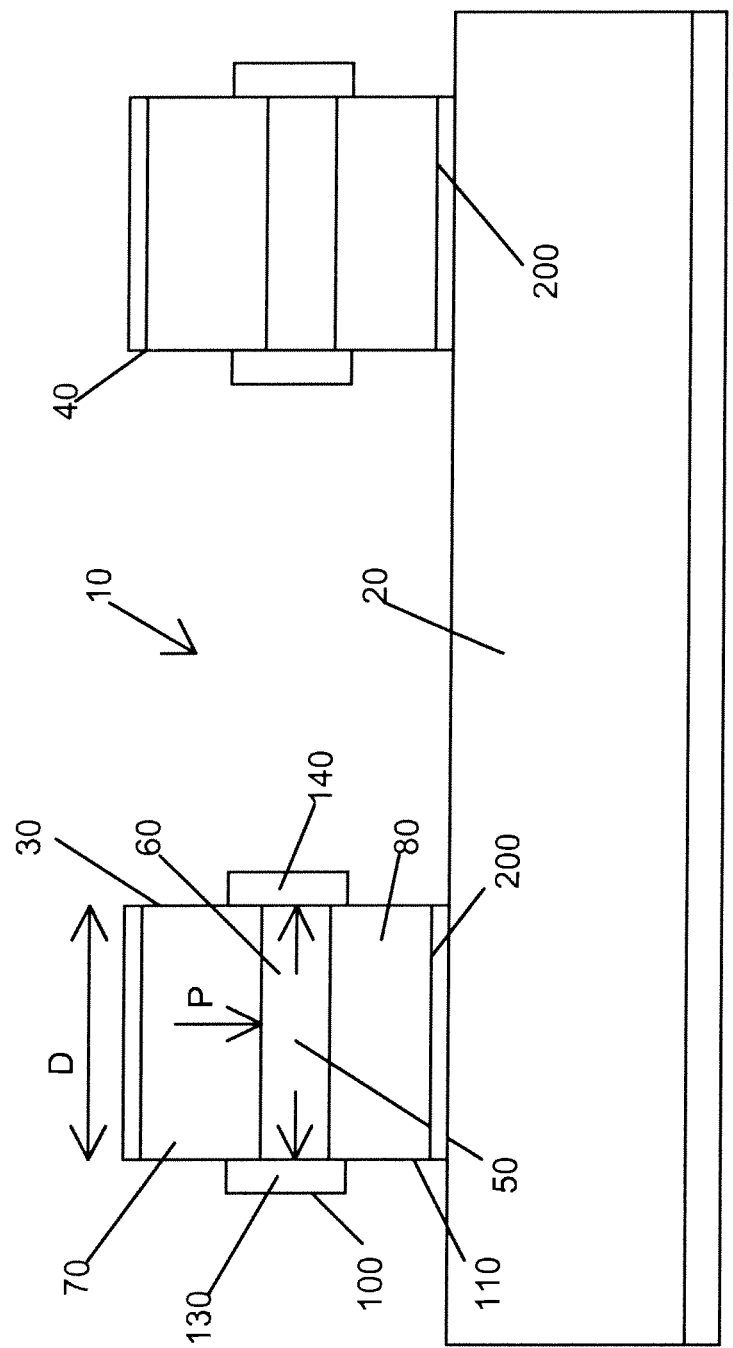
Figure 4:
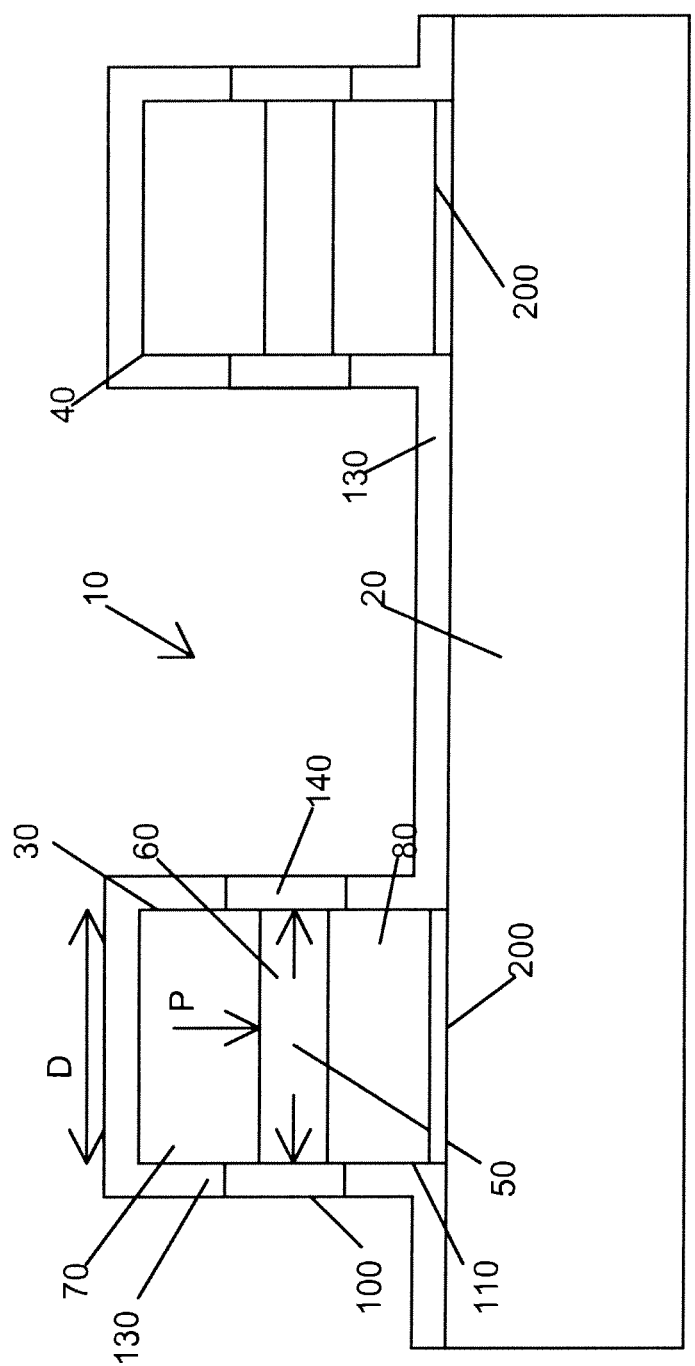
Figure 5:
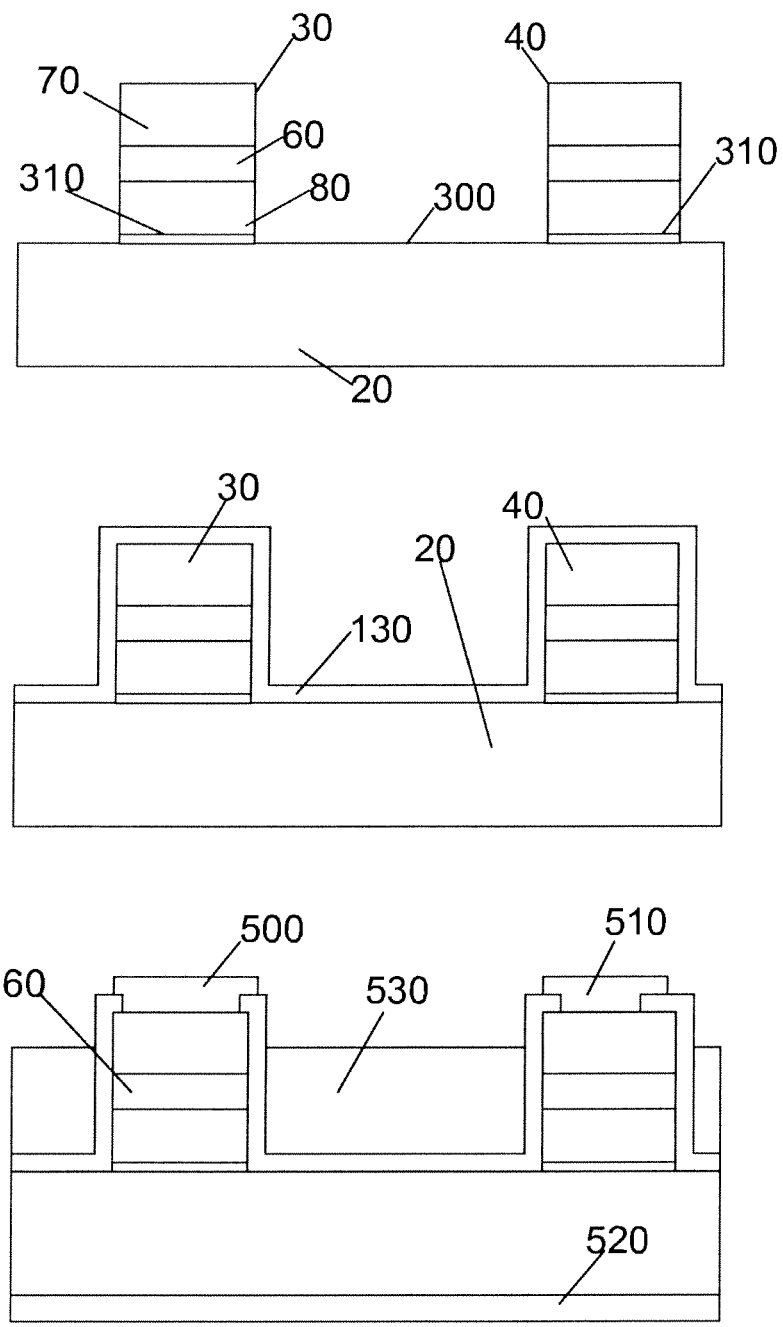

The invention is explained in greater detail below on the basis of exemplary embodiments; in this case, by way of example:

FIG. 1 shows a first exemplary embodiment of an arrangement according to the invention comprising two semiconductor cylinders, the lateral surface of which is in each case radially enclosed by an optically active ring, FIG. 2 shows a second exemplary embodiment of an arrangement according to the invention, in which organic material covers the entire lateral surface of the semiconductor cylinders, FIG. 3 shows a third exemplary embodiment of an arrangement according to the invention, in which a buffer layer is arranged between semiconductor cylinders and substrate, FIG. 4 shows a fourth exemplary embodiment of an arrangement according to the invention, in which organic material is situated over the whole area on the lateral surfaces of the semiconductor cylinders and a buffer layer is present between semiconductor cylinders and substrate, and FIG. 5 shows an exemplary embodiment of a method for producing an arrangement according to the invention.

For the sake of clarity, the same reference signs are always used for identical or comparable components in the figures.

FIG. 1 illustrates an exemplary embodiment of an arrangement 10 for generating electromagnetic radiation. A substrate 20 can be discerned, on which a multiplicity of semiconductor cylinders are arranged, two of which are shown by way of example in FIG. 1 and are identified by the reference signs 30 and 40.

The two semiconductor cylinders 30 and 40 can be structurally identical, for example, such that, by way of example, exclusively the semiconductor cylinder 30 on the left in FIG. 1 is described in greater detail below.

A charge carrier injection zone 50 can be discerned in FIG. 1, said charge carrier injection zone being formed by a weakly doped or undoped cylinder layer 60 of the semiconductor cylinder 30. The cylinder layer 60 is enclosed by two highly or at least more highly doped cylinder layers 70 and 80. The cylinder layer 70 can be p-doped, for example, and the cylinder layer 80 n-doped, such that the three cylinder layers 60, 70 and 80 form a pin diode structure.

In order to achieve a high charge carrier density in the charge carrier injection zone 50 or the cylinder layer 60, the band gap in the cylinder layer 60 is preferably smaller than the band gap in the adjacent cylinder layers 70 and 80. By way of example, the cylinder layers 70 and 80 consist of gallium nitride (GAN) and the cylinder layer 60 consists of indium gallium nitride (InGaN).

FIG. 1 furthermore reveals an optically active ring 100, which consists of an optically active organic material (e.g. organic semiconductor material) and bears radially on the outside of the lateral surface 110 of the semiconductor cylinder 30. The position of the optically active ring 100 is preferably chosen in such a way that the latter bears at least in sections on the outside of the charge carrier injection zone 50 or cylinder layer 60.

The diameter D of the semiconductor cylinder 30 is preferably chosen in such a way that it is less than the diffusion length of charge carriers injected into the charge carrier injection zone 50. Such a dimensioning of the semiconductor cylinder 30 has the effect that when an electrical voltage is applied to the pin diode formed by the cylinder layers 60, 70 and 80, charge carriers are injected into the charge carrier zone 50, which charge carriers can diffuse within the charge carrier injection zone 50 perpendicularly to the main current path P and reach the optically active ring 100. This enables the charge carriers injected into the charge carrier zone 50 to enter, by non-radiative energy transfer, into the organic material 130 of the optically active ring 100 and to recombine there with emission of electromagnetic radiation. In the case of such a recombination, the optically active ring will foini a radiation ring, which is identified by the reference sign 140 in FIG. 1.

In the exemplary embodiment in accordance with FIG. 1, the charge carrier injection zone 50 is formed by a single weakly doped or undoped cylinder layer 60, the band gap of which is smaller than the band gap of the two adjacent cylinder layers 70 and 80. The three cylinder layers 60, 70 and 80 thus form a quantum well structure having a single layer having a smaller band gap. Alternatively, the charge carrier injection zone 50 can also be formed by a multi-quantum well structure in which a plurality of layers having different band gaps adjoin one another in order to achieve a particularly efficient charge carrier concentration along the main current direction P in the region of the optically active ring 100.

FIG. 2 shows by way of example an exemplary embodiment of an arrangement 10 for generating electromagnetic radiation, in which optically active organic material 130 is applied over the whole area on the lateral surface 110 of the semiconductor cylinders 30 and 40. For the rest, the arrangement 10 in accordance with FIG. 2 corresponds to the arrangement in accordance with FIG. 1.

During the operation of the arrangement 10, as a result of an electrical voltage being applied to the pin diode structure formed by the cylinder layers 60, 70 and 80, charge carriers are injected into the charge carrier injection zone 50, which diffuse laterally—perpendicularly to the main current path direction P—outward and enter into the organic material 130 by non-radiative energy transfer and recombine there with emission of electromagnetic radiation.

Since, on account of the charge carrier concentration in the charge carrier injection zone 50, the charge carrier pairs will primarily penetrate into the organic material 130 through the lateral surface 110 in the region of the charge carrier zone 50, there the charge carrier density will be particularly high and the emission of electromagnetic radiation will be particularly high. Consequently, a radiation ring that emits the electromagnetic radiation will form in the optically active organic material 130. The radiation ring is identified by the reference sign 140 in FIG. 2.

Therefore, although the entire lateral surface 110 of the semiconductor cylinders 30 and 40 is covered with optically active organic material 130 in the exemplary embodiment in accordance with FIG. 2, only a relatively small section of the layer situated on the lateral surface 110 will actually generate electromagnetic radiation.

FIG. 3 shows by way of example an arrangement 10 for generating electromagnetic radiation, in which an optically active ring 100 composed of optically active organic material 130 is in each case formed on the lateral surface 110 of the semiconductor cylinders 30 and 40. In contrast to the exemplary embodiment in accordance with FIG. 1, the semiconductor cylinders 30 and 40 are not placed directly on the substrate 20, but rather are separated from the substrate 20 by a buffer layer 200. The function of such a buffer layer may serve, for example, to act as a seed surface during a deposition process by which the semiconductor cylinders 30 and 40 are grown on the substrate 20.

For the rest, the exemplary embodiment in accordance with FIG. 3 corresponds to the exemplary embodiment in accordance with FIG. 1.

FIG. 4 shows by way of example an exemplary embodiment of an arrangement 10 for generating electromagnetic radiation, in which the optically active organic material 130 is applied on the entire lateral surface 110 of the semiconductor cylinders 30 and 40 and in which a buffer layer 200 is additionally present between the semiconductor cylinders 30 and 40 and the substrate 20. The buffer layer 200 promotes—in the same way as in the exemplary embodiment in accordance with FIG. 3—a growth of the semiconductor cylinders 30 and 40 on the substrate 20. For the rest, reference is made to the above explanations in connection with FIG. 2.

FIG. 5 illustrates by way of example a method for producing the arrangement 10 in accordance with FIG. 4. A substrate 20 can be discerned, to the surface 300 of which firstly a growth seed layer is applied. The growth seed layer is structured such that growth seed surfaces 310 are formed, on which the growth of the semiconductor cylinders 30 and 40 to be grown is intended to be effected. The function of the growth seed surfaces 310 is to enable a self-assembled nanowire growth during an MBE deposition process on the substrate 20 (cf. "Axial and radial growth of Ni-induced GaN nanowires", L. Geelhaar, C. Chèze, W. M. Weber, R. Averbeck, H. Riechert, Th. Kehagias, Ph. Komninou, G. P. Dimitrakopulos, Th. Karakostas, Appl. Phys. Lett. 91 (2007) 093113: "Ferromagnet-semiconductor nanowire coaxial heterostructures grown by molecular-beam epitaxy", M. Hilse, Y. Takagaki, J. Herfort, M. Ramsteiner, C. Herrmann, S. Breuer, L. Geelhaar, H. Riechert, Appl. Phys. Lett. 95 (2009) 133126).

In a subsequent process step, inorganic semiconductor material, for example n-doped gallium nitride, is grown on the substrate 20; in this case, particularly fast growth and the formation of cylindrical structures occur on the growth seed surfaces 310.

Afterward, further cylinder layers, for example a weakly doped or undoped cylinder layer 60 composed of indium gallium nitride and a p-doped cylinder layer 70 composed of p-doped gallium nitride, are deposited in the context of the self-assembled nanoneedle growth mechanism already mentioned. The structure shown in FIG. 5 (upper illustration) is thus formed.

Subsequently, optically active organic material 130 is deposited over the whole area on the substrate 20 and the two semiconductor cylinders 30 and 40; the resulting structure is illustrated in FIG. 5 (middle).

Afterward, the semiconductor cylinders 30 and 40 are contact-connected with electrical contacts 500, 510 and 520 in order to simplify electrical driving of the semiconductor cylinders 30 and 40 and charge carrier injection into the cylinder layer 60.

The region present between the semiconductor cylinders 30 and 40 can be filled with a transparent filling material 530, for example. The transparent filling material 530 can be identical to the organic material 130, for example.

LIST OF REFERENCE SIGNS

10 Arrangement
20 Substrate
30 Semiconductor cylinder
40 Semiconductor cylinder
50 Charge carrier injection zone
60 Cylinder layer
70 Cylinder layer
80 Cylinder layer
100 Ring
110 Lateral surface
130 Organic material
140 Radiation ring
200 Buffer layer
300 Surface
310 Growth seed surface
500 Contact
510 Contact
520 Contact
530 Filling material
D Diameter
P Main current path

The invention claimed is:

1. An arrangement for generating electromagnetic radiation, wherein the arrangement comprises inorganic semiconductor material and organic material,
    a semiconductor cylinder composed of inorganic semiconductor material and
    a charge carrier injection zone situated in the semiconductor cylinder, wherein
        the charge carrier injection zone adjoins the lateral surface of the semiconductor cylinder,
        the organic material is suitable for emitting electromagnetic radiation in the case of a charge carrier recombination, and
    the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material, preferably by non-radiative energy transfer, and excite there the emission of electromagnetic radiation by recombination, and wherein
    the charge carrier injection zone is formed by a cylinder layer arranged transversely with respect to the cylinder longitudinal axis of the semiconductor cylinder, and
    the organic material forms an optically active ring bearing radially on the outside of said cylinder layer of the semiconductor cylinder.

2. An arrangement for generating electromagnetic radiation, wherein the arrangement comprises inorganic semiconductor material and organic material, a semiconductor cylinder composed of inorganic semiconductor material and a charge carrier injection zone situated in the semiconductor cylinder, wherein the charge carrier injection zone adjoins the lateral surface of the semiconductor cylinder, the organic material is suitable for emitting electromagnetic radiation in the case of a charge carrier recombination, and the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material, preferably by non-radiative energy transfer, and excite there the emission of electromagnetic radiation by recombination, and wherein the semiconductor cylinder comprises at least one cylinder layer composed of p-doped inorganic material and at least one cylinder layer composed of n-doped inorganic material, and the charge carrier injection zone lies between the p-doped and n-doped cylinder layers.

3. An arrangement for generating electromagnetic radiation, wherein the arrangement comprises inorganic semiconductor material and organic material, a semiconductor cylinder composed of inorganic semiconductor material and a charge carrier injection zone situated in the semiconductor cylinder, wherein the charge carrier injection zone adjoins the lateral surface of the semiconductor cylinder, the organic material is suitable for emitting electromagnetic radiation in the case of a charge carrier recombination, and the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material, preferably by non-radiative energy transfer, and excite there the emission of electromagnetic radiation by recombination, and wherein the semiconductor cylinder comprises at least one weakly doped or undoped cylinder layer, and the charge carrier injection zone lies in the weakly doped or undoped cylinder layer.

4. The arrangement as claimed in claim 3, wherein the p-doped, the n-doped and the weakly or undoped cylinder layers form a pin diode.

5. The arrangement as claimed in claim 1, wherein the organic material consists of or at least comprises a conjugated polymer or conjugated molecules. Polymers or molecules include, for example, monomers or covalently bonded units of thiophene, phenylene, phenylenevinylene, fluorene, quinoxaline, arylamine, pyridine or organic transition or heavy metal complexes.

6. The arrangement as claimed in claim 2, wherein the cylinder diameter (D) of the semiconductor cylinder is less than the diffusion length of charge carriers situated in the charge carrier injection zone.

7. The arrangement as claimed in claim 3, wherein the band gap of the inorganic semiconductor material in the charge carrier injection zone is between 2.5 and 3.3 eV.

8. An arrangement for generating electromagnetic radiation, wherein the arrangement comprises inorganic semiconductor material and organic material, a semiconductor cylinder composed of inorganic semiconductor material and a charge carrier injection zone situated in the semiconductor cylinder, wherein the charge carrier injection zone adjoins the lateral surface of the semiconductor cylinder, the organic material is suitable for emitting electromagnetic radiation in the case of a charge carrier recombination, and the organic material bears indirectly or directly on that section of the lateral surface of the semiconductor cylinder which is adjoined by the charge carrier injection zone and electron-hole pairs from the charge carrier injection zone of the semiconductor cylinder can enter into the organic material, preferably by non-radiative energy transfer, and excite there the emission of electromagnetic radiation by recombination, and wherein the semiconductor cylinder has a quantum well structure comprising at least one cylinder layer having a small band gap and at least two adjacent cylinder layers having a larger band gap by comparison therewith, and the organic material forms an optically active ring bearing radially on the outside of at least one cylinder layer having a small band gap.

* * * * *